(12) United States Patent
Fang et al.

(10) Patent No.: US 11,239,291 B2
(45) Date of Patent: Feb. 1, 2022

(54) DISPLAY DEVICE WITH CURRENT COMPENSATION AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Liang Fang, Hubei (CN); Ding Ding, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 300 days.

(21) Appl. No.: 16/489,402

(22) PCT Filed: Apr. 18, 2019

(86) PCT No.: PCT/CN2019/083246
§ 371 (c)(1),
(2) Date: Aug. 28, 2019

(87) PCT Pub. No.: WO2020/172971
PCT Pub. Date: Sep. 3, 2020

(65) Prior Publication Data
US 2021/0335923 A1    Oct. 28, 2021

(30) Foreign Application Priority Data
Feb. 28, 2019 (CN) .......................... 201910149955.6

(51) Int. Cl.
*H01L 29/08* (2006.01)
*H01L 27/32* (2006.01)
*H01L 51/56* (2006.01)

(52) U.S. Cl.
CPC .......... *H01L 27/3244* (2013.01); *H01L 51/56* (2013.01); *H01L 2227/323* (2013.01)

(58) Field of Classification Search
CPC ................................................... H01L 27/3244
See application file for complete search history.

(56) References Cited

U.S. PATENT DOCUMENTS 8,653,523 B2* 2/2014 Sato ..................... H01L 27/124
257/59
10,074,669 B2* 9/2018 Lius .................... H01L 27/1222
(Continued)

FOREIGN PATENT DOCUMENTS

CN        107481686 A    12/2017
CN        107507838 A    12/2017
(Continued)

*Primary Examiner* — Caleb E Henry

(57) ABSTRACT

A display device and a manufacturing method thereof. The display device includes a display area and a non-display area. The display area includes a substrate, a first insulating layer, a first gate layer, a second insulating layer, and a second gate layer. The non-display area includes an integrated circuit area, and a thickness of the second insulating layer is gradually decreased from a vicinity of the integrated circuit area toward a direction away from the integrated circuit area. The manufacturing method of the display device includes a preparation step of disposing a substrate, a preparation step of disposing a first insulating layer, a preparation step of disposing a first gate layer, a preparation step of disposing a second insulating layer, and a preparation step of disposing a second gate layer.

8 Claims, 4 Drawing Sheets

(56) References Cited

U.S. PATENT DOCUMENTS

| | | | |
|---|---|---|---|
| 10,281,753 B1 | 5/2019 | Xing et al. | |
| 2007/0279566 A1 | 12/2007 | Huang | |
| 2008/0122351 A1* | 5/2008 | Kitazume | H01L 51/5234 |
| | | | 313/504 |
| 2015/0035167 A1* | 2/2015 | Wang | H01L 27/124 |
| | | | 257/774 |
| 2015/0379923 A1* | 12/2015 | Lee | H01L 27/3272 |
| | | | 345/206 |
| 2016/0300865 A1* | 10/2016 | Yamazaki | H01L 29/78675 |
| 2016/0315134 A1* | 10/2016 | Nishido | H01L 51/56 |
| 2016/0321996 A1 | 11/2016 | Lee et al. | |
| 2017/0125452 A1* | 5/2017 | Ide | H01L 27/1225 |
| 2017/0284883 A1* | 10/2017 | Yang | G01L 9/08 |
| 2017/0294493 A1* | 10/2017 | Yoo | H01L 27/3218 |
| 2018/0061722 A1* | 3/2018 | Byun | H01L 51/524 |
| 2018/0331132 A1* | 11/2018 | Zeng | H01L 29/786 |
| 2019/0148474 A1 | 5/2019 | Bu | |
| 2019/0266944 A1 | 8/2019 | Li | |
| 2020/0175933 A1 | 6/2020 | He | |

FOREIGN PATENT DOCUMENTS

| | | |
|---|---|---|
| CN | 107994055 A | 5/2018 |
| CN | 108269529 A | 7/2018 |

\* cited by examiner

DISPLAY DEVICE WITH CURRENT COMPENSATION AND MANUFACTURING METHOD THEREOF

FIELD OF INVENTION

The present disclosure relates to a display field, in particular, relates to a display device and a manufacturing method thereof.

BACKGROUND OF INVENTION

Organic light emitting diode (OLED) display devices have unique advantages of low power consumption, high saturation, fast response times, and wide viewing angles, and has gradually become the mainstream technology in the display field. It has a wide applications in cars, mobile phones, tablets, computers, and TV products.

One mainstream driving method of the OLED display device is current driving, wherein operating current is transmitted by the display device through a source/drain. There is a certain resistance in the source/drain, and there is a voltage drop (IR Drop) in signal transmission. In the display area, the voltage and current in the area close to the driving circuit are large, and the voltage and current in the area away from the driving circuit are small. Therefore, brightness of the two ends of the display area is significantly different, and the display device has uneven brightness, which affects performance of the product.

Referring to FIG. 1, a method for solving the uneven brightness of the OLED display device is a two-layer source/drain structure at present, and the two-layer source/drain structure includes a first source/drain layer 131 and a second source/drain layer 132. The second source/drain layer 132 is designed by a mesh structure, and the voltage drop is controlled by the parallel circuit, thereby improving the brightness unevenness of the product. However, the design of the two-layer source/drain structure restricts its application due to the complicated manufacturing process and high cost.

SUMMARY OF THE INVENTION

An object of the present disclosure is to provide a display device and a manufacturing method thereof, which solve the technical problems that the manufacturing process of the two-layer source/drain structure existing in the prior art is complicated, the cost is high, the brightness of the display device is uneven, and the application range is narrow.

To achieve the above objects, the present disclosure provides a display device, and the display device comprises a display area and a non-display area surrounding the display area, wherein the display area includes a substrate, a first insulating layer, a first gate layer, a second insulating layer, and a second gate layer; the non-display area includes an integrated circuit area, and a thickness of the second insulating layer is gradually decreased from a vicinity of the integrated circuit area toward a direction away from the integrated circuit area.

In one embodiment of the present disclosure, the display area is divided into N-numbered sub-display areas arranged side by side, and the N-numbered sub-display areas are arranged in order from the vicinity of the integrated circuit area toward the direction away from the integrated circuit area.

In one embodiment of the present disclosure, a thickness of the second insulating layer located at the (X+1)-numbered sub-display area is less than a thickness of the second insulating layer located at the X-numbered sub-display area; and/or a capacitance of the (X+1)-numbered sub-display area is larger than a capacitance of the X-numbered sub-display area, wherein $N \geq X \geq 2$.

In one embodiment of the present disclosure, in the display area, the first gate layer is disposed on a side surface of the first insulating layer away from the substrate; the second insulating layer is disposed on a side surface of the first gate layer away from the first insulating layer; and the second gate layer is disposed on a side surface of the second insulating layer away from the first gate layer.

In one embodiment of the present disclosure, the display area includes a barrier layer, a buffer layer, an active layer, the first insulating layer, the first gate layer, the second insulating layer, the second gate layer, a dielectric layer, a source/drain layer, and a planarization layer; the barrier layer is disposed on a side surface of the substrate; the buffer layer is disposed on a side surface of the barrier layer away from the substrate; the active layer is disposed on a side surface of the buffer layer away from the barrier layer; the first insulating layer is disposed on a side surface of the active layer and the buffer layer away from the barrier layer; the first gate layer is disposed on a side surface of the first insulating layer away from the active layer; the second insulating layer is disposed on a side surface of the first gate layer and the first insulating layer away from the active layer; the second gate layer is disposed on a side surface of the second insulating layer away from the first gate layer; the dielectric layer is disposed on a side surface of the second gate layer and the second insulating layer away from the first insulating layer; the source/drain layer is sequentially passing through the dielectric layer, the first insulating layer, and the second insulating layer, and connected to the active layer; the planarization layer is disposed on a side surface of the source/drain layer and the dielectric layer away from the substrate.

To achieve the above objects, the present disclosure provides a manufacturing method of a display device, the display device includes a display area and a non-display area surrounding the display area, the non-display area includes an integrated circuit area, and the manufacturing method comprises steps of a preparation step of disposing a substrate, a preparation step of disposing a first insulating layer, a preparation step of disposing a first gate layer, a preparation step of disposing a second insulating layer, and a preparation step of disposing a second gate layer. In the preparation step of disposing the second insulating layer, a thickness of the second insulating layer is gradually decreased from a vicinity of the integrated circuit area toward a direction away from the integrated circuit area.

In one embodiment of the present disclosure, the preparation step of disposing the second insulating layer includes steps of a photoresist layer coating step of coating a photoresist solution on the second insulating layer to form a photoresist layer, an exposing step of exposing the photoresist layer with a halftone mask such that a thickness of the photoresist layer gradually is decreased from a vicinity of the integrated circuit area toward a direction away from the integrated circuit area, and an etching step of etching the second insulating layer by using the photoresist layer as a mask.

In one embodiment of the present disclosure, the display area is divided into N-numbered sub-display areas arranged side by side, and the N-numbered sub-display areas are arranged in order from the vicinity of the integrated circuit area toward the direction away from the integrated circuit area; in the exposing step, a thickness of the photoresist layer located at the (X+1)-numbered sub-display area is less than a thickness of the photoresist layer located at the X-numbered sub-display area, wherein N≥X≥2.

In one embodiment of the present disclosure, in the preparation step of disposing the first insulating layer, the first insulating layer is formed on an upper surface of the substrate; in the preparation step of disposing the first gate layer, the first gate layer is formed on an upper surface of the first insulating layer; in the preparation step of disposing the second insulating layer, the second insulating layer is formed on an upper surface of the first gate layer; in the preparation step of disposing the second gate layer, the second gate layer is formed on an upper surface of the second insulating layer.

In one embodiment of the present disclosure, the preparation step of disposing the substrate includes steps of a barrier layer deposition step of depositing a barrier layer on an upper surface of the substrate, a buffer layer deposition step of depositing a buffer layer on an upper surface of the barrier layer, and an active layer deposition step of depositing an active layer on an upper surface of the buffer layer away from a side surface of the barrier layer. After the preparation step of disposing the second gate layer, the manufacturing method includes steps of a dielectric layer deposition step of depositing a dielectric layer on an upper surface of the second gate layer, a digging step of disposing at least two source/drain holes to sequentially penetrate through the dielectric layer, the second insulating layer, and the first insulating layer, a source/drain layer deposition step of depositing a source/drain layer in the source/drain holes to connect to the active layer, and a planarization layer deposition step of depositing a planarization layer on an upper surface of the source/drain layer and the dielectric layer.

A technical effect of the present disclosure is to provide a display device and a manufacturing method thereof. In the display area of the display device, the voltage gradually decreases from the vicinity of the integrated circuit area to the direction away from the integrated circuit area, and the input current also gradually decreases. The two gate layers and the insulating layer therebetween form storage capacitors. When a thickness of the insulating layer gradually decreases from the vicinity of the integrated circuit area toward the direction away from the integrated circuit area, the capacitance value of the storage capacitor gradually increases from the vicinity of the integrated circuit area to the direction away from the integrated circuit area. The current compensation is used to improve the uneven brightness of the display device, and the product manufacturing process is simplified, the production cost is reduced, and the product is widely used.

1 substrate; 2 barrier layer; 3 buffer layer; 4 active layer; 5 first insulating layer; 6 first gate layer; 7 P-type semiconductor layer; 8 second insulating layer; 9 photoresist layer; 10 second gate layer; 11 dielectric layer; 13 source/drain layer; 131 first source/drain; 132 second source/drain; 14 planarization layer; 16 pixel electrode layer; 17 pixel definition layer; 18 photoresist gap layer; 100 first sub-display area; 200 second sub-display area; 300 X-numbered sub-display area; 301 (X+1)-numbered sub-display area; 400 N-numbered sub display area; 1000 display area; 2000 non-display area; 3000 pixel points; 4000 integrated circuit area; 5000 signal transmission line.

DETAILED DESCRIPTION OF PREFERRED EMBODIMENTS

Structure and technical means adopted by the present disclosure to achieve the above and other objects can be best understood by referring to the following detailed description of the preferred embodiments and the accompanying drawings. Furthermore, directional terms described by the present disclosure, such as upper, lower, front, back, left, right, inner, outer, side, longitudinal/vertical, transverse/horizontal, etc., are only directions by referring to the accompanying drawings, and thus the used directional terms are used to describe and understand the present disclosure, but the present disclosure is not limited thereto.

Figure 1:
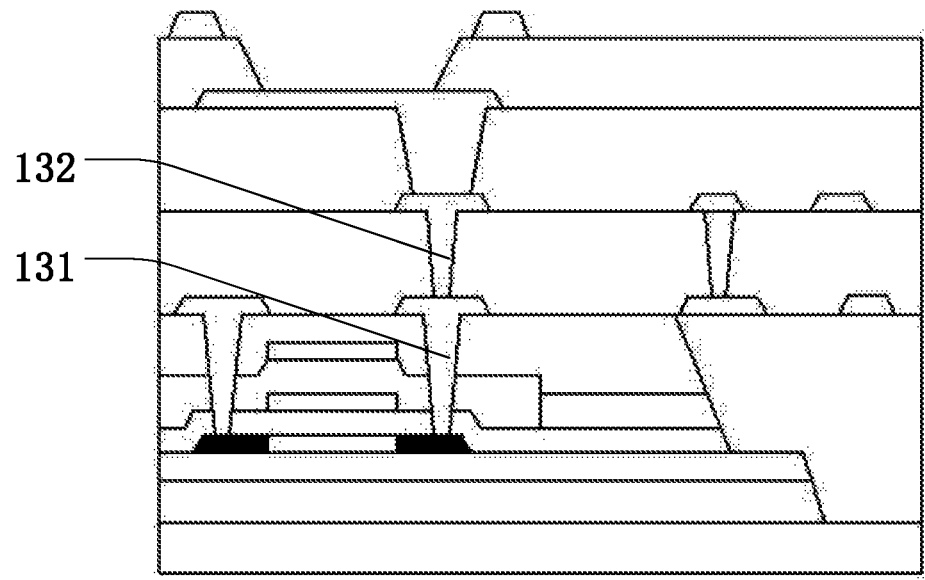
FIG. 1 is a cross-sectional view of a display device in the background art.
Figure 2:
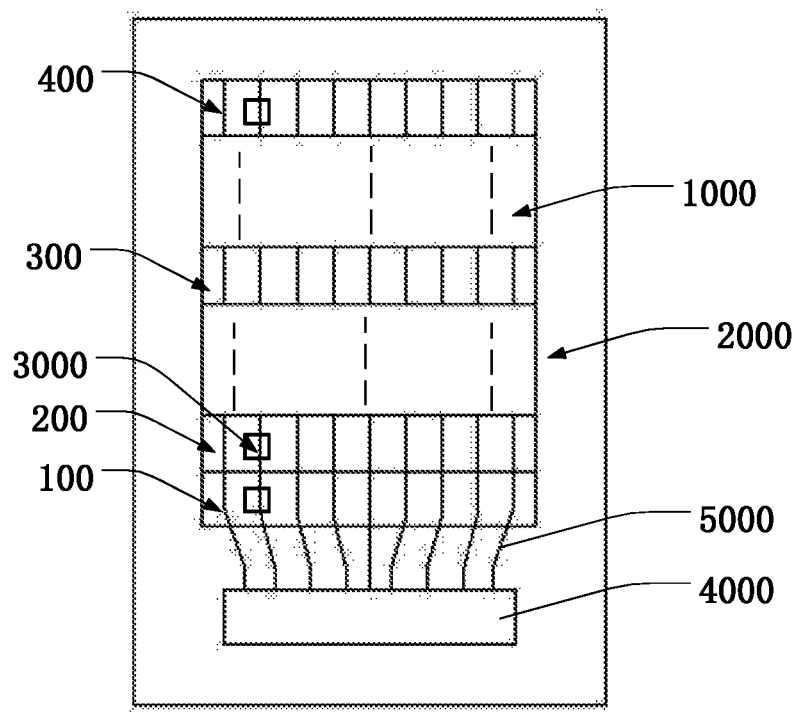
FIG. 2 is a schematic structural view of a display device according to an embodiment of the present disclosure.

Referring to FIG. 2, a display device is provided according to an embodiment of the present disclosure. The display device comprises a display area 1000 and a non-display area 2000, and the display area 1000 is surrounded by the non-display area 2000. The non-display area 2000 includes an integrated circuit area 4000 (IC chip). Operational signals are transmitted from the integrated circuit area 4000 to the display area 1000 through signal transmission lines 5000.

The display area 100 is divided into N-numbered sub-display areas arranged side by side, wherein N≥2. The N-numbered sub-display areas are arranged in order from the vicinity of the integrated circuit area 4000 toward the direction away from the integrated circuit area 4000, and the N-numbered sub-display areas are a first sub-display area 100, a second sub-display area 200, a X-numbered sub-display area 300, and a N-numbered sub-display area, wherein N≥X≥2.

Each of the sub-display areas contains a plurality of pixel points 3000. The design of the pixels 3000 in the same sub-display area are the same. Each of the pixel points 3000 is a circuit control unit, and the OLED lighting unit is individually controlled for display. Each of the pixel points 3000 contains a storage capacitor. The storage capacitors of the corresponding pixel points in different sub-display areas have different capacitance values. In the embodiment, the storage capacitor gradually increases from the vicinity of the integrated circuit region 4000 toward the direction away from the integrated circuit area 4000. The current compensation makes the display area more uniform in illumination, and simplifies the product manufacturing process, reduces the production cost, and improves the wide applicability of the product.

Hereinafter, the X-numbered sub-display area 300 and the (X+1)-numbered sub-display area 301 will be described in detail as an example.

Figure 3:
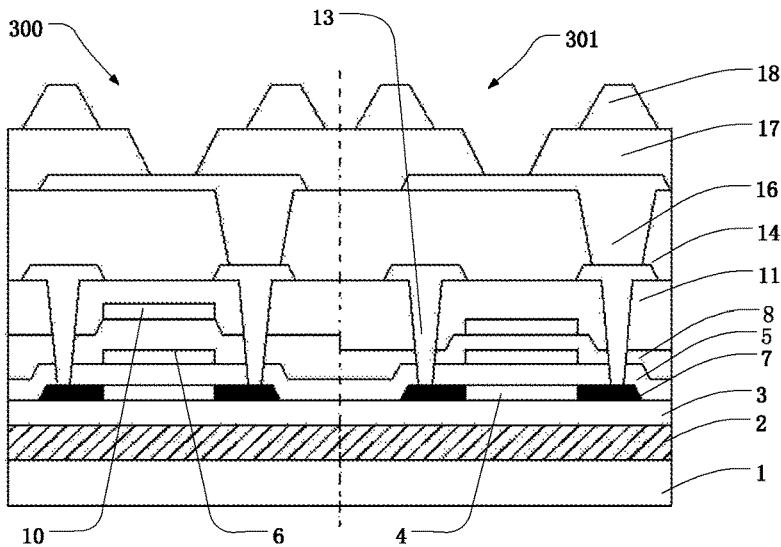
FIG. 3 is a cross-sectional view of another display device according to an embodiment of the present disclosure.

Referring to FIG. 3, the display area 1000 includes a substrate 1, a barrier layer 2, a buffer layer 3, an active layer 4, a first insulating layer 5, a first gate layer 6, a second insulating layer 8, a second gate layer 10, a dielectric layer 11, source/drain holes 12, a source/drain layer 13, a planarization layer 14, a pixel electrode layer 16, a pixel definition layer 17, and a photoresist gap layer 18.

The substrate 1 is a flexible polyimide (PI) substrate, the barrier layer 2, the buffer layer 3 and the active layer 4 are sequentially disposed from the bottom to the top on the substrate 1. The first insulating layer 5, the first gate layer 6, the second insulating layer 8, and the second gate layer 10 are sequentially disposed on the upper surface of the active layer 4. The gate layers 6, 10 and the second insulating layer 8 therebetween form storage capacitors.

In the display area, when a thickness of the second insulating layer 8 located in the (X+1)-numbered sub-display area 300 is consistent with a thickness of the second insulating layer 8 located in the X-numbered sub-display area 301, there is a certain resistance at source/drain. The voltage gradually decreases from the vicinity of the integrated circuit area to the direction away from the integrated circuit area. Therefore, the current of the (X+1)-numbered sub-display area 301 is smaller than the current of the X-numbered sub-display area 300. The brightness of the (X+1)-numbered sub-display area 301 is less than the brightness of the X-numbered sub-display area 300, resulting in uneven brightness of the entire display area.

When a thickness of the second insulating layer 8 located in the X-numbered sub-display area 300 is greater than a thickness of the second insulating layer 8 located in the (X+1)-numbered sub-display area 301, the capacitance value of the storage capacitor of the (X+1)-numbered sub-display area 301 is greater than the capacitance value of the storage capacitor of the X-numbered sub-display area 300. The real-time current of the (X+1)-numbered sub-display area 301 is approximately equal to the real-time current of the X-numbered sub-display area 300 by current compensation, thereby making the brightness of the entire display area more uniform.

The dielectric layer 11 and the planarization layer 14 are sequentially disposed from the bottom to the top on the second insulating layer 8. The source/drain layer 13 passes through the dielectric layer 11, the planarization layer 14, and is connected to the active layer 4. The pixel electrode layer 16, the pixel definition layer 17, and the photoresist gap layer 18 are disposed sequentially from the bottom to the top on the planarization layer 14. The pixel electrode layer 16 is connected to the source/drain layer 13.

Figure 4:
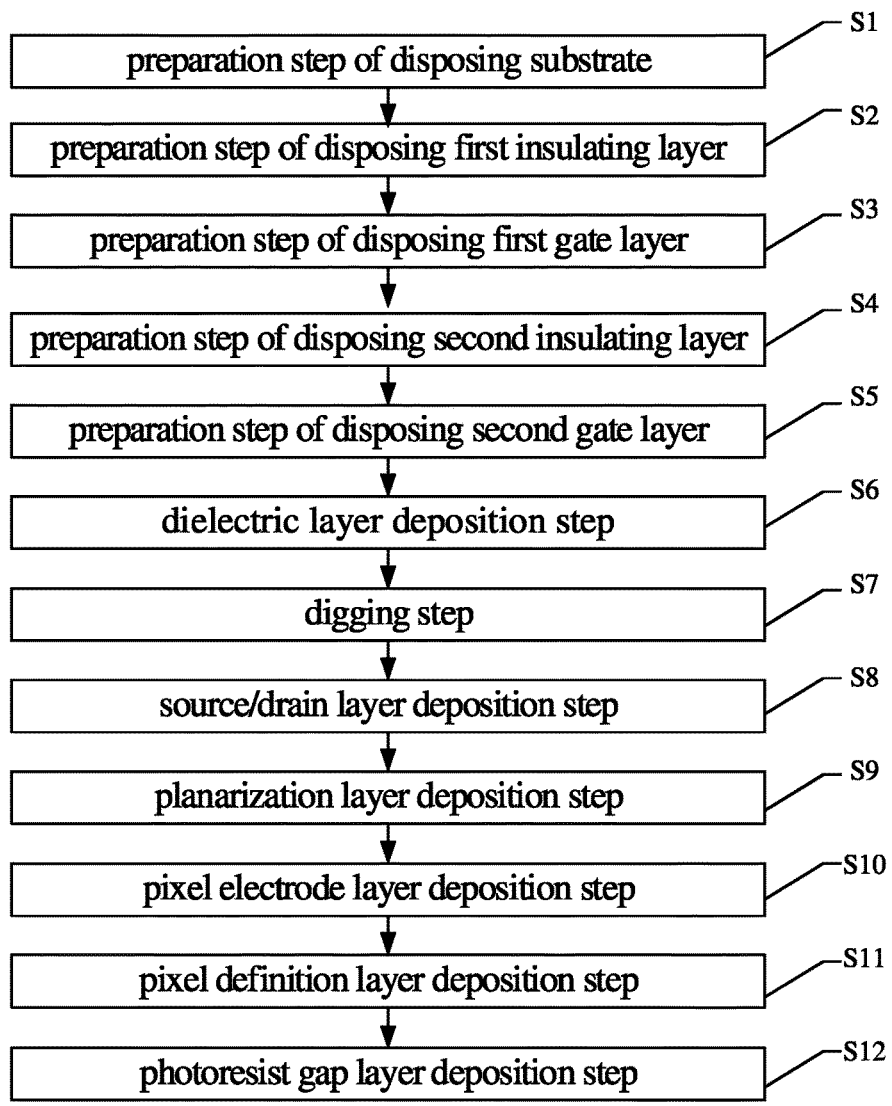
FIG. 4 is a flowchart of a manufacturing method of the display device according to the embodiment of the present disclosure.

Referring to FIG. 4, a flowchart of a manufacturing method of the display device according to the embodiment of the present disclosure is illustrated, wherein the manufacturing method includes steps S1 to S12.

Figure 5:
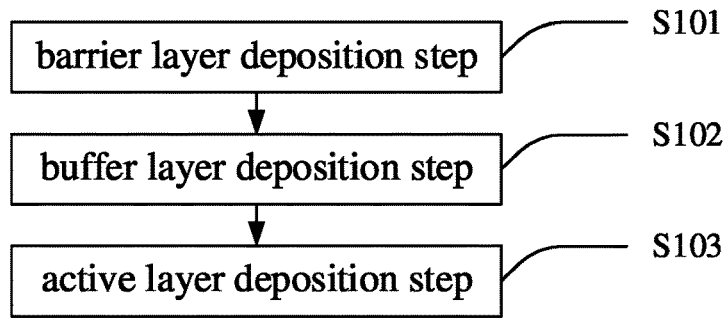
FIG. 5 is a flowchart of a formation of a substrate according to the embodiment of the present disclosure.

Referring to FIG. 5, the step S1 is a preparation step of disposing a substrate, and includes steps S101 to S103. The step S101 is a barrier layer deposition step of depositing a layer with inorganic material to form a barrier layer 2 on an upper surface of a flexible polyimide (PI) substrate 1 for protecting the substrate 1 and other components. The step S102 is a buffer layer deposition step of depositing a layer with inorganic material to form a buffer layer 3 on an upper surface of the barrier layer 2 for using to form a buffer between the substrate and other components. The step S103 is an active layer deposition step of depositing an active layer 4 on an upper surface of the buffer layer 3, and the active layer 4 is polysiliconized by excimer laser crystallization technology, see FIG. 6.

Figure 6:
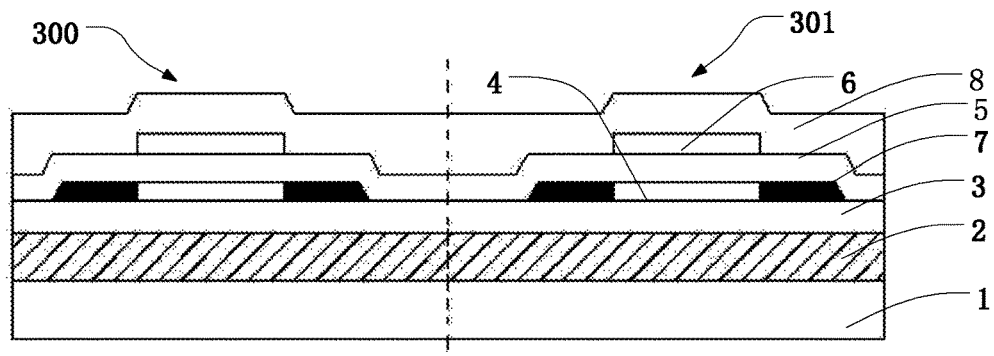
FIG. 6 is a cross-sectional view of the display device of a second insulating layer according to the embodiment of the present disclosure.

The step S2 is a preparation step of disposing a first insulating layer, wherein the first insulating layer 5 is disposed on the upper surface of the active layer 4, see FIG. 6.

The step S3 is a preparation step of disposing a first gate layer, wherein the first gate layer 6 is formed on the upper surface of the first insulating layer 5. The first gate layer 6 is patterned by a single photolithography mask. The patterned first gate layer 6 is used as a mask, and the active layer 4 is ion-implanted to form a P-type semiconductor layer on the active layer 4, see FIG. 6.

The step S4 is a preparation step of disposing a second insulating layer, wherein the second insulating layer 8 is formed on the upper surface of the first gate layer 6. The second insulating layer 8 has the same thickness at different positions, see FIG. 6.

Figure 7:
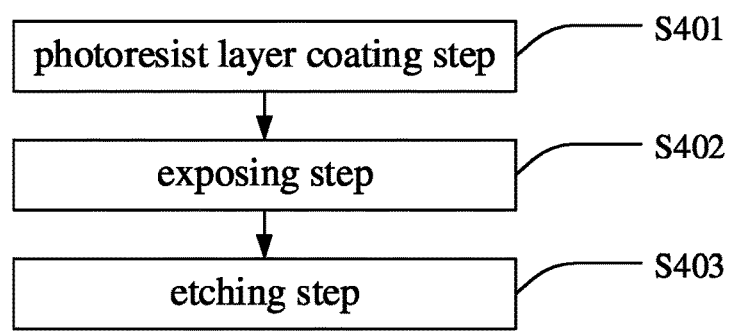
FIG. 7 is a flowchart of a second insulating layer according to the embodiment of the present disclosure.

Referring to FIG. 7, the step S4 includes steps S401 to S403 in sequence.

The step S401 is a photoresist layer coating step of coating a photoresist solution on the second insulating layer 8 to form a photoresist layer 9. A thickness of the photoresist layer 9 located in the X-numbered sub-display region 300 is the same as a thickness of the photoresist layer 9 located in the (X+1)-numbered sub-display region 301.

Figure 8:
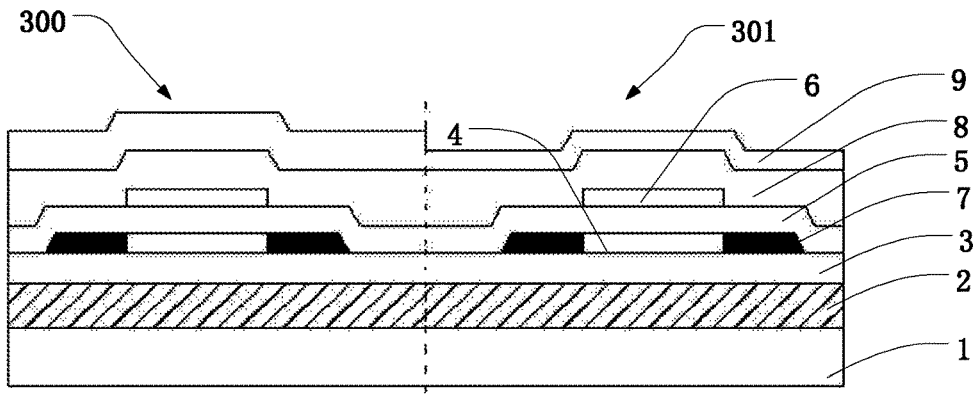
FIG. 8 is a cross-sectional view of the display device after exposure according to the embodiment of the present disclosure.

The step S402 is an exposing step of exposing the photoresist layer 9 with a halftone mask such that a thickness of the photoresist layer 9 located in the X-numbered sub-display region 300 is greater than a thickness of the photoresist layer 9 located in the (X+1)-numbered sub-display region 301, see FIG. 8.

In the embodiment, the halftone mask adjusts the transmittance of light such that the transmittance of each sub-display area gradually increases from the vicinity of the integrated circuit area toward the direction away from the integrated circuit area. Therefore, the thickness of the photoresist layer 9 gradually decreases from the vicinity of the integrated circuit area toward the direction away from the integrated circuit area, see FIG. 8.

Figure 9:
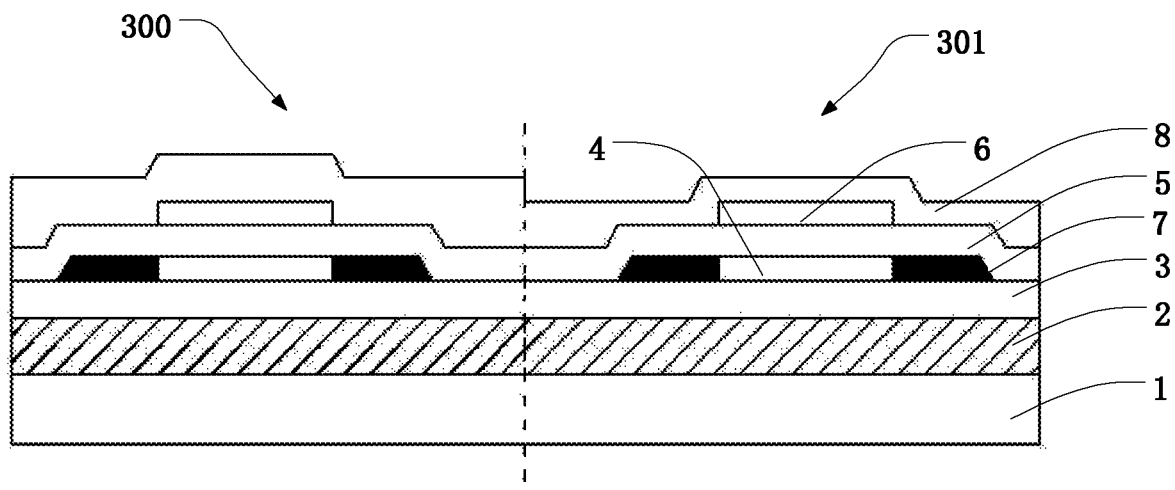
FIG. 9 is a cross-sectional view of the second insulating layer of the display device after etching according to the embodiment of the present disclosure.

The step S403 is an etching step of etching the second insulating layer 8 by using the photoresist layer as a mask, wherein a thickness of the second insulating layer 8 located in the X-numbered sub-display area 300 is greater than the thickness of the second insulating layer 8 located in the (X+1)-numbered sub-display area 301, see FIG. 9.

The step S5 is a preparation step of disposing a second gate layer, wherein the second gate layer 10 is deposited on the upper surface of the second insulating layer 8, and the second gate layer 10 is patterned by a single photolithographic mask process, see FIG. 3.

In the embodiment, the first gate layer 6 is a lower plate of the capacitor, and the second gate layer 10 is an upper plate of the capacitor. The first gate layer 6, the second gate layer 10, and the second insulating layer 8 therebetween form storage capacitors. A thickness of the second insulating layer 8 in the (X+1)-numbered sub-display area 301 is smaller than a thickness in the X-numbered sub-display area 300. The capacitance value of the storage capacitor of the (X+1)-numbered sub-display area 301 is greater than the capacitance value of the storage capacitor of the X-numbered sub-display area 300. By means of current compensation, the real-time current of the (X+1)-numbered sub-display area 301 is approximately equal to the real-time current of the X-numbered sub-display area 300, thereby making the brightness of the entire display area more uniform.

The step S6 is a dielectric layer deposition step of depositing a dielectric layer 11 on an upper surface of the second gate layer, see FIG. 2.

The step S7 is a digging step of disposing at least two source/drain holes (not shown) on the dielectric layer 11 by single photolithography mask method, and penetrate through the dielectric layer 11 to the active layer 4, see FIG. 3.

The step S8 is a source/drain layer deposition step of depositing a source/drain layer 13 in the source/drain holes, the source/drain layers 13 are patterned by a single photolithography mask, and the source/drain layer 13 are connected to the active layer 4. In the display area of the display device, the voltage gradually decreases from the vicinity of the integrated circuit area to the direction away from the integrated circuit area, and the input current also gradually decreases. Therefore, the prior art adopts a mesh structure to design a second source/drain layer, and the parallel circuit controls the voltage drop, thereby improving product brightness unevenness. The source/drain layer 13 in the embodiment have a single layer structure. In the embodiment, the storage capacitor of each of sub-display areas is set to improve the uneven brightness of the display device. It is also possible to simplify the fabrication process of the source/drain layer, thereby reducing production costs and increasing the versatility of product use, see FIG. 3.

The step S9 is a planarization layer deposition step of depositing a planarization layer 14 on an upper surface of the source/drain layer 13. At least one through hole (not shown) is provided in the planarization layer 14, and the through hole penetrates to the upper surface of the source/drain layer 13, see FIG. 3.

The step S10 is a pixel electrode layer deposition step, a pixel electrode layer 16 is deposited in the through hole, and the pixel electrode layer 16 covers a portion of the planarization layer 14. The pixel electrode layer 16 is patterned by a single photolithographic mask, as shown in FIG. 3.

The step S11 is a pixel definition layer deposition step, a pixel definition layer 17 is deposited on the upper surface of the pixel electrode layer 16, and the pixel definition layer 17 is patterned by a single photolithography mask or two photolithography masks, and the pixel definition layer 17 is caused to be patterned, see FIG. 3.

The step S12 is a photoresist gap layer deposition step, a photoresist gap layer 18 is formed on the upper surface of the pixel definition layer 17, and the photoresist gap layer 18 is patterned by a single photolithography mask or two photolithography masks, see FIG. 3.

In a subsequent step, the pixel definition layer is subjected to a hole opening process, and a light emitting layer is prepared in an opening region to form a basic structure of the display device.

In the embodiment, a display device and a manufacturing method thereof are provided. In the display area of the display device, the voltage gradually decreases from the vicinity of the integrated circuit area to the direction away from the integrated circuit area, and the input current also gradually decreases. The two gate layers and the insulating layer therebetween form storage capacitors. When a thickness of the insulating layer gradually decreases from the vicinity of the integrated circuit area toward the direction away from the integrated circuit area, the capacitance value of the storage capacitor gradually increases from the vicinity of the integrated circuit area to the direction away from the integrated circuit area. The current compensation is used to improve the uneven brightness of the display device, and the product manufacturing process is simplified, the production cost is reduced, and the product is widely used.

The present disclosure has been described with preferred embodiments thereof and it is understood that many changes and modifications to the described embodiments can be carried out without departing from the scope and the spirit of the disclosure that is intended to be limited only by the appended claims.

What is claimed is:

1. A display device, comprising:
   a display area and a non-display area surrounding the display area, wherein the display area includes a substrate, a first insulating layer, a first gate layer, a second insulating layer, and a second gate layer;
   wherein the non-display area includes an integrated circuit area, and a thickness of the second insulating layer gradually decreases from a vicinity of the integrated circuit area toward a direction away from the integrated circuit area;
   wherein the display area is divided into N-numbered sub-display areas arranged side by side, and the N-numbered sub-display areas are arranged in order from the vicinity of the integrated circuit area toward the direction away from the integrated circuit area;
   a thickness of the second insulating layer located at the (X+1)-numbered sub-display area is less than a thickness of the second insulating layer located at the X-numbered sub-display area; and/or
   a capacitance of the (X+1)-numbered sub-display area is larger than a capacitance of the X-numbered sub-display area, wherein $N \geq X \geq 2$.

2. The display device according to claim 1, wherein in the display area, the first gate layer is disposed on a side surface of the first insulating layer away from the substrate;
   the second insulating layer is disposed on a side surface of the first gate layer away from the first insulating layer; and
   the second gate layer is disposed on a side surface of the second insulating layer away from the first gate layer.

3. The display device according to claim 1, wherein the display area further includes:
   a barrier layer disposed on a side surface of the substrate;
   a buffer layer disposed on a side surface of the barrier layer away from the substrate;
   an active layer disposed on a side surface of the buffer layer away from the barrier layer;
   the first insulating layer disposed on a side surface of the active layer and the buffer layer away from the barrier layer;
   the first gate layer disposed on a side surface of the first insulating layer away from the active layer;
   the second insulating layer disposed on a side surface of the first gate layer and the first insulating layer away from the active layer;
   the second gate layer disposed on a side surface of the second insulating layer away from the first gate layer;
   a dielectric layer disposed on a side surface of the second gate layer and the second insulating layer away from the first insulating layer;
   a source/drain layer sequentially passing through the dielectric layer, the first insulating layer, and the second insulating layer, and connected to the active layer; and a planarization layer disposed on a side surface of the source/drain layer and the dielectric layer away from the substrate.

4. A manufacturing method of a display device, wherein the display device includes a display area and a non-display area surrounding the display area, the non-display area includes an integrated circuit area, and the manufacturing method comprises steps of:
 a preparation step of disposing a substrate;
 a preparation step of disposing a first insulating layer;
 a preparation step of disposing a first gate layer;
 a preparation step of disposing a second insulating layer; and
 a preparation step of disposing a second gate layer;
 wherein in the preparation step of disposing the second insulating layer, a thickness of the second insulating layer is gradually decreased from a vicinity of the integrated circuit area toward a direction away from the integrated circuit area.

5. The manufacturing method according to claim 4, wherein the preparation step of disposing the second insulating layer includes steps of:
 a photoresist layer coating step of coating a photoresist solution on the second insulating layer to form a photoresist layer;
 an exposing step of exposing the photoresist layer with a halftone mask such that a thickness of the photoresist layer gradually is decreased from a vicinity of the integrated circuit area toward a direction away from the integrated circuit area; and
 an etching step of etching the second insulating layer by using the photoresist layer as a mask.

6. The manufacturing method according to claim 4, wherein the display area is divided into N-numbered sub-display areas arranged side by side, and the N-numbered sub-display areas are arranged in order from the vicinity of the integrated circuit area toward the direction away from the integrated circuit area; and
 in the exposing step, a thickness of the photoresist layer located at the (X+1)-numbered sub-display area is less than a thickness of the photoresist layer located at the X-numbered sub-display area, wherein $N \geq X \geq 2$.

7. The manufacturing method according to claim 4, wherein in the preparation step of disposing the first insulating layer, the first insulating layer is formed on an upper surface of the substrate;
 in the preparation step of disposing the first gate layer, the first gate layer is formed on an upper surface of the first insulating layer;
 in the preparation step of disposing the second insulating layer, the second insulating layer is formed on an upper surface of the first gate layer;
 in the preparation step of disposing the second gate layer, the second gate layer is formed on an upper surface of the second insulating layer.

8. The manufacturing method according to claim 4, wherein the preparation step of disposing the substrate includes steps of:
 a barrier layer deposition step of depositing a barrier layer on an upper surface of the substrate;
 a buffer layer deposition step of depositing a buffer layer on an upper surface of the barrier layer; and
 an active layer deposition step of depositing an active layer on an upper surface of the buffer layer away from a side surface of the barrier layer;
 wherein after the preparation step of disposing the second gate layer, the manufacturing method includes steps of:
 a dielectric layer deposition step of depositing a dielectric layer on an upper surface of the second gate layer;
 a digging step of disposing at least two source/drain holes to sequentially penetrate through the dielectric layer, the second insulating layer, and the first insulating layer;
 a source/drain layer deposition step of depositing a source/drain layer in the source/drain holes to connect to the active layer; and
 a planarization layer deposition step of depositing a planarization layer on an upper surface of the source/drain layer and the dielectric layer.

\* \* \* \* \*